(12) United States Patent
Tan et al.

(10) Patent No.: US 11,599,197 B2
(45) Date of Patent: Mar. 7, 2023

(54) PASSIVE HAPTICS AS REFERENCE FOR ACTIVE HAPTICS

(71) Applicant: Microsoft Technology Licensing, LLC, Redmond, WA (US)

(72) Inventors: Hong Z. Tan, Beijing (CN); Zhaoyuan Ma, Beijing (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/491,709

(22) Filed: Oct. 1, 2021

(65) Prior Publication Data

US 2022/0019287 A1 Jan. 20, 2022

Related U.S. Application Data

(63) Continuation of application No. 15/738,550, filed as application No. PCT/CN2015/082441 on Jun. 26, 2015, now Pat. No. 11,163,362.

(51) Int. Cl.
| | |
|---|---|
| *G06F 3/01* | (2006.01) |
| *G06F 1/16* | (2006.01) |
| *G06F 3/0488* | (2022.01) |
| *H01L 41/09* | (2006.01) |

(52) U.S. Cl.
CPC .............. *G06F 3/016* (2013.01); *G06F 1/163* (2013.01); *G06F 1/1607* (2013.01); *G06F 1/1637* (2013.01); *G06F 3/0488* (2013.01); *H01L 41/09* (2013.01)

(58) Field of Classification Search
CPC ...... G06F 1/163; G06F 1/1637; G06F 1/1607; G06F 3/016; G06F 3/0488; H01L 41/09
See application file for complete search history.

(56) References Cited

U.S. PATENT DOCUMENTS

| | | | | |
|---|---|---|---|---|
| 7,986,303 | B2* | 7/2011 | Braun ..................... | A63F 13/24 345/163 |
| 8,212,772 | B2* | 7/2012 | Shahoian ................ | A63F 13/06 345/161 |
| 8,638,308 | B2* | 1/2014 | Cunningham .......... | G06F 3/038 345/173 |
| 8,917,167 | B1* | 12/2014 | Selker ..................... | G06F 3/016 340/407.1 |
| 9,063,570 | B2* | 6/2015 | Weddle ............... | G06F 3/04883 |
| 9,280,205 | B2* | 3/2016 | Rosenberg ............ | G06F 3/0416 |

(Continued)

OTHER PUBLICATIONS

"Office Action Issued in European Patent Application No. 15895969. 2", dated Mar. 22, 2022, 13 Pages.

(Continued)

*Primary Examiner* — Vinh T Lam

(57) ABSTRACT

An electronic device may include a housing (100), a display (102) disposed in the housing (100) and including an interface surface (112) arranged for user contact and a reference haptic (108). The interface surface (112) includes an active haptic output that provides a time-dependent haptic output and a reference haptic (108) disposed on the housing or the interface surface to provide a time-independent haptic output related to the time-dependent haptic output. The combination of active and reference haptics on an electronic device, such as a wearable display device, can convey information to a user without requiring the user to look at the device.

20 Claims, 8 Drawing Sheets

(56) References Cited

U.S. PATENT DOCUMENTS

| | | | |
|---|---|---|---|
| 9,489,046 B2 * | 11/2016 | Cruz-Hernandez | ............................ |
| | | | A63F 13/214 |
| 9,645,646 B2 * | 5/2017 | Cowley | ................... G06F 3/016 |
| 9,740,399 B2 * | 8/2017 | Paek | ....................... G06F 3/023 |
| 9,829,979 B2 * | 11/2017 | Brombach | .............. G06F 3/016 |
| 9,898,087 B2 * | 2/2018 | Lisseman | .............. G06F 3/0414 |
| 10,007,342 B2 * | 6/2018 | Lisseman | .............. G06F 3/0414 |
| 10,166,466 B2 * | 1/2019 | Brav | ....................... G06F 3/012 |
| 10,534,900 B2 * | 1/2020 | Cheong | ................ A61B 5/0022 |
| 10,591,992 B2 * | 3/2020 | Feng | ................... G06F 3/04886 |
| 10,628,025 B2 * | 4/2020 | White | ................. G06F 3/04842 |
| 2010/0127999 A1 * | 5/2010 | Kim | .................... G09B 21/003 |
| | | | 345/173 |
| 2010/0267424 A1 * | 10/2010 | Kim | ................... G06F 3/04883 |
| | | | 345/173 |

OTHER PUBLICATIONS

"Notice of Allowance Issued in European Patent Application No. 15895969.2", dated Oct. 21, 2022, 8 Pages.

* cited by examiner

PASSIVE HAPTICS AS REFERENCE FOR ACTIVE HAPTICS

CROSS-REFERENCE TO RELATED APPLICATIONS

This application is a continuation application of U.S. patent application Ser. No. 15/738,550, filed on Dec. 20, 2017, which application is a U.S. National Stage Application of PCT/CN2015/082441, filed Jun. 26, 2015, the entire disclosures of which are hereby incorporated herein by reference.

BACKGROUND

Electronic devices have become an integral part of everyday life for many people. Many of these electronic devices, including portable devices (e.g., laptops, phones, and tablets) and wearable devices (e.g., bands and watches), include display screens upon which content is displayed for visual consumption by the user. Thus, for example, a user is required to look at her device to do almost any task, including telling time, determining a sender of a received message or e-mail, and the like. It can be inconvenient, distracting, and in some social settings, rude, to divert attention to view a device screen.

SUMMARY

This application describes an improved electronic device that conveys information to a user via haptics disposed on the device. In at least one example, a device described herein includes a display screen having an interface surface at which a changing haptic output is perceptible to a user. The device also includes a reference haptic related to the changing haptic output. The reference haptic may be disposed on the interface surface or on a device housing. Both the changing haptic output and the reference haptic are perceptible via user contact with the device, e.g., by touching the device. In some implementations, the user can contemporaneously contact both the interface surface (and thus the changing haptic output) and the reference haptic. Using the reference haptic as a landmark or a contextual positioning device, the user may be able to interpret information conveyed via the changing haptic output without looking at the device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Figure 1:
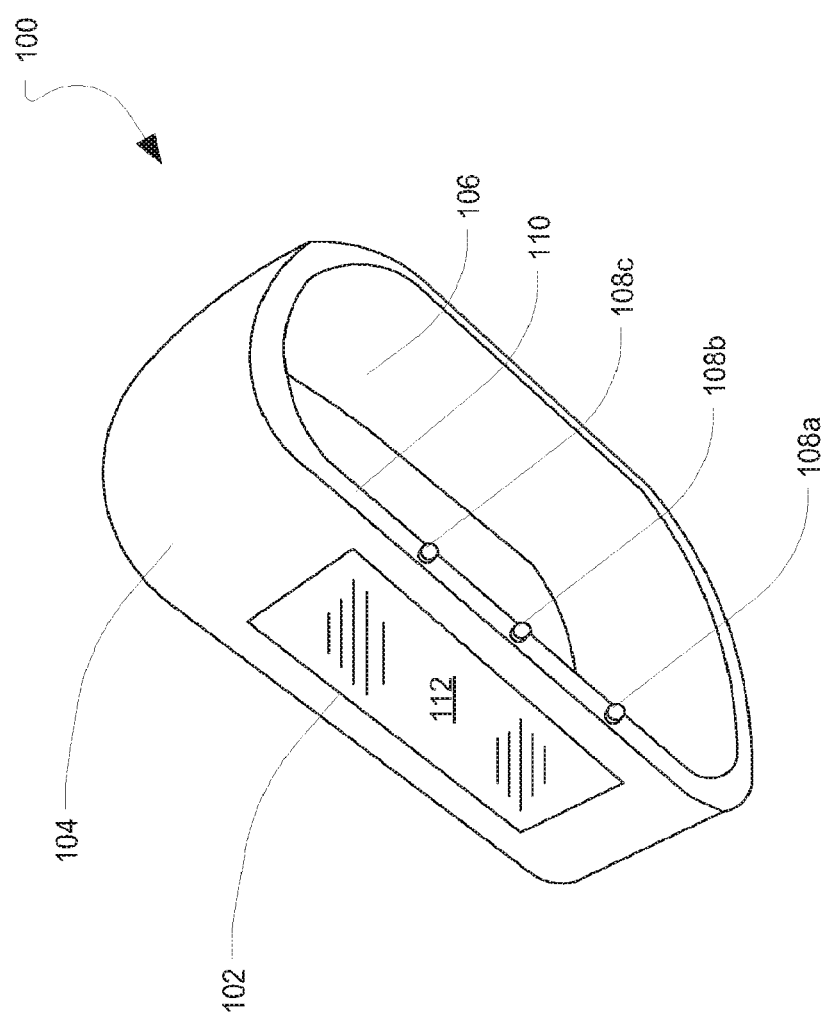
FIG. 1 is a perspective view of an electronic device incorporating active and passive haptics according to one or more examples of this disclosure.
Figure 2:
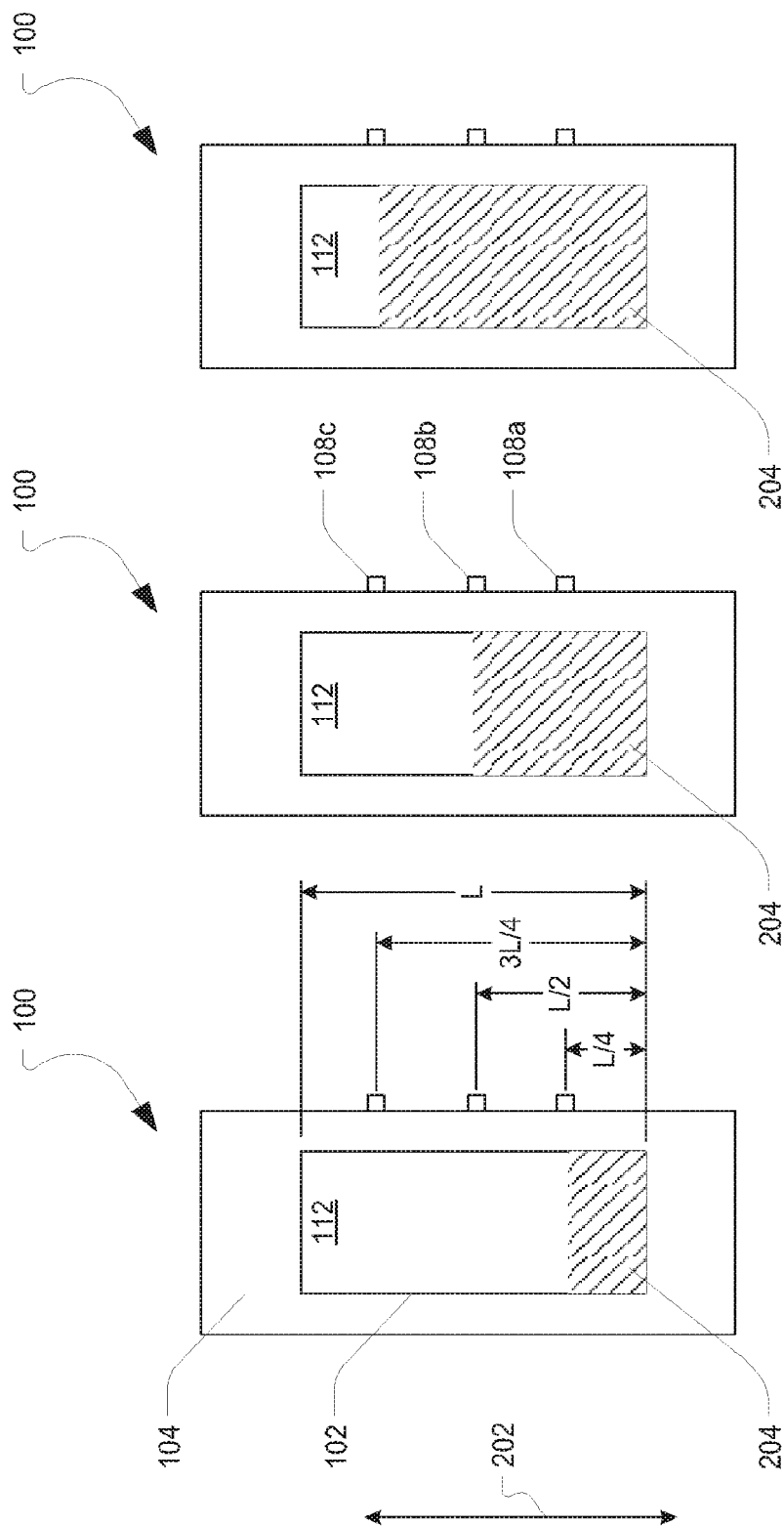
FIGS. 2A-2C are plan views illustrating various example states of the electronic device of FIG. 1 in an example application using the device.
Figure 3:
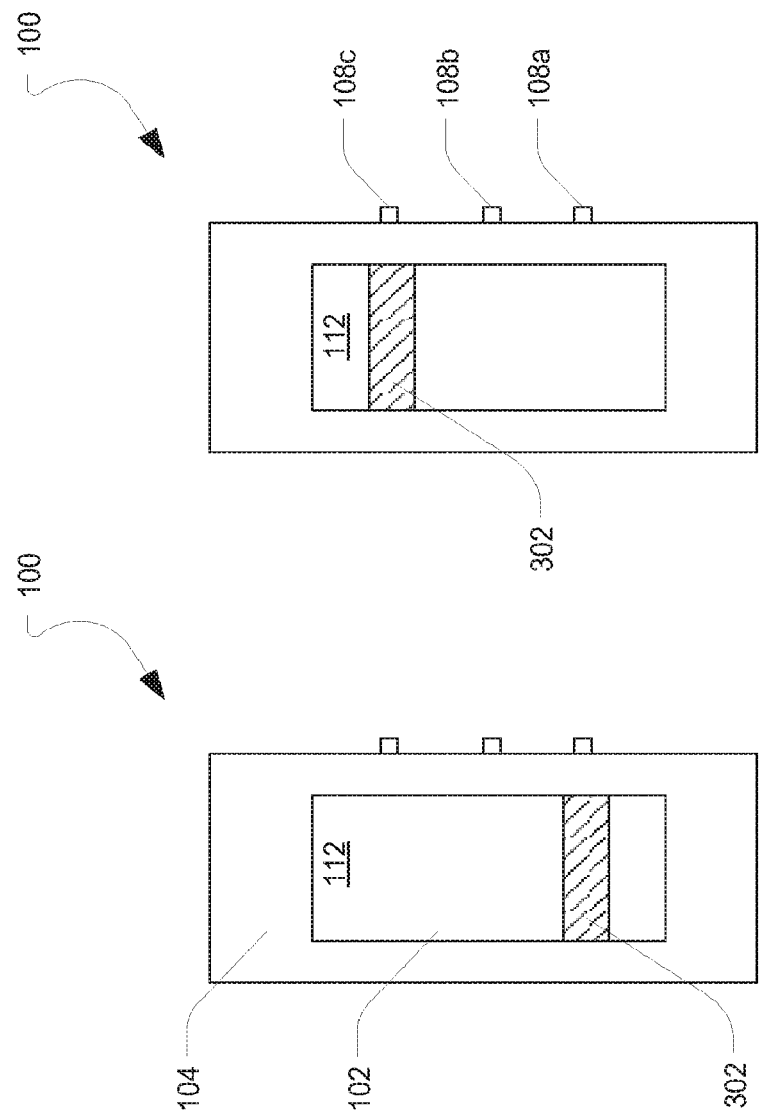
FIGS. 3A and 3B are plan views illustrating various states of the electronic device of FIG. 1 in an example application using the device.

Examples of the present disclosure are directed to, among other things, techniques and systems for conveying information to a user via an electronic device, in some instances without the need for the user to look at the device.

The techniques and systems disclosed herein utilize active haptics to convey information and reference haptics to convey context for that information. In some implementations, an electronic device may include a housing, a display disposed in the housing and including an interface surface arranged for user contact, and a reference haptic also arranged for user contact. An active haptic output may be provided at the interface surface, perceptible to the user via user contact with the interface surface. The reference haptic provides a time-independent haptic output that is related to the active haptic. In some implementations, for example, the first haptic and the reference haptic are disposed for contemporaneous or substantially simultaneous user contact, for the user to receive information without looking at the electronic device.

As used herein, the term "haptic" refers to a feature, condition, or signal that is perceptible by touch, as well as to the devices and structures that impart such conditions or signals. Thus, for example, "haptic output" generally refers to a feature, condition, or signal that is generated and is perceptible by a user through touch. A "haptic" may include a surface feature such as an indentation, protrusion, or texture and/or a perceived surface feature, such as a perceived friction on a surface, e.g., resulting from modulating surface friction of a glass substrate.

As also used herein, the term "haptic display" or "active haptic display" generally refers to a type of display that includes an interface surface at which a haptic output may be provided. The haptic output may be provided by haptics integrated into the display, or by a separate haptic component, layer, or supplement configured to implement the haptic aspects. Some haptic displays include a glass panel and the haptic output is achieved by modulating surface friction at areas of the glass. In some examples, the surface friction at areas of the glass may be modulated using piezoelectric actuators arranged at the periphery of the device. Driving actuators on opposite edges of the glass, e.g., at an ultrasonic frequency may cause the glass to move in a direction normal to the glass panel. This movement can trap air between the user fingertip and the glass, effectively reducing the friction between the finger and the glass, causing the user to feel a change in friction at the surface.

Other glass-panel haptics may use an electrostatic effect to modulate the surface friction of the glass. In these examples, a transparent conducting layer and an insulator are placed on the glass surface. When an electric signal is sent to the conducting layer, an opposite charge is realized in the fingertip. Varying the electrical signal strength changes the user's perception, resulting in the feeling of roughness on a smooth glass surface. Other, mechanical haptic displays also are known. In these examples, the surface may include a deformable, e.g., plastic, surface that can, using actuators, be caused to change a surface topography. The foregoing are non-limiting examples of haptic display technologies.

Various examples, scenarios, and aspects are described further with reference to FIGS. 1-8.

FIG. 1 illustrates an example electronic device 100 that incorporates active and passive haptic feedback for conveying information to a user of the device 100. As illustrated, the device 100 is embodied as a wearable electronic device, such as a bracelet, a watch, or a band. The device 100 generally includes a display 102 visible to a user wearing or otherwise interacting with the device 100. A housing 104 holds the display screen 102 as well as any and all additional electronic components associated with the device 100. A strap 106 is illustrated, also. The strap 106 may incorporate a fastener or latch (not shown) to promote retention of the device 100 on the wearer. The device 100 also includes three reference haptics 108a, 108b, 108c (collectively, reference haptics 108) disposed on a surface 110 of the housing 104.

The display 102 is illustrated schematically in FIG. 1 and may be implemented using any number of display technologies. A top surface of the display 102 provides a user interface surface 112. Via the user interface surface 112, a user may view content displayed on the device 100. As will be described in more detail below, the display 102 is a haptic display, capable of providing a haptic output. For example, the display 102 may include components that modulate a surface friction of the interface surface 112. The modulation of surface friction is perceptible via user contact with the interface surface 112. For example, modulating surface friction at selected areas of the interface surface can give the effect to a user of different surface texture, e.g., a roughness, instead of a smooth surface where friction is not modulated.

The housing 104 may be sized and shaped to contain the components of the display 102 behind the interface surface 112, as well as other electronics and computing components necessary for functioning of the device. Depending upon the device, desired aesthetics, and the like, the device may take different sizes and shapes.

The strap 106 is provided as an illustrative mechanism for allowing the user to wear the device 100. The illustrated straps may be formed as a part of the housing 104, or they may be fabricated separately, for subsequent attachment. Other or additional devices may be incorporated to facilitate use of the device. Although the device 100 is illustrated as a wearable electronic device, the electronic device 100 need not be wearable. Moreover, features and aspects of this disclosure may be incorporated into wearable devices other than the device 100 illustrated. By way of non-limiting example, features and aspects of this disclosure may be incorporated into glasses, a ring, a necklace, a hat, a belt, a glove, or the like.

The reference haptics 108 are features that provide a tactile sensation to a user of the device 100. In the illustrated examples the reference haptics 108 are provided as stationary protrusions extending from the surface 110, which is a side of the housing 104. In FIG. 1, the reference haptics 108a, 108b, 108c comprise three spaced-apart protrusions, although more of fewer may be provided. Moreover, although the reference haptics 110 are illustrated as protrusions, some or all could instead be formed as indentations or other features that are perceptible by user touch.

FIGS. 2A-2C are plan views of the device 100 and illustrate a user experience of interacting with the device 100. In those figures, a user may interact with the device by contemporaneously contacting the interface surface 112 and the side surface 110. For example, the user's right thumb may contact the interface surface 112 and the user's right forefinger may contact the side surface 110. Sliding the thumb and the forefinger along the respective surfaces, for example, in a direction along arrow 202, will allow the user to feel contemporaneously the interface surface 112 as well as the reference haptics 108 on the side surface 110.

In implementations of this disclosure, the display 102 is a haptic display controllable to provide a haptic output at a portion or the entirety of the interface surface 112. Thus, the interface surface may be smooth, such as a piece of glass, or a haptic output may be perceived on the interface surface 112. In FIGS. 2A-2C, cross-hatching is used to illustrate a haptic portion 204 of the interface surface 112. The haptic portion 208 is a portion at which the haptic output is perceptible. If a user were to touch the interface surface 112 other than in the haptic portion 204, the interface surface 112 may feel smooth or otherwise unaffected, whereas the haptic portion 204 would create a different tactile perception. For example, the haptic portion 204 may feel rough to the touch. Thus, in FIG. 2A, the haptic portion 208 of the interface surface 112 at which the haptic output is perceptible is a relatively small portion, proximate the bottom (in the illustration) of the interface surface. In FIG. 2B, roughly half of the interface surface 112 includes the haptic portion 204 and in FIG. 3B, nearly all of the interface surface 112 includes the haptic portion 204.

FIGS. 2A-2C represent three different times in one application of the present disclosure, in which the size of the haptic portion 204 varies with time. For example, the display 102 may be controlled to linearly increase the size of the haptic portion 204 relative to the interface surface 112 for a given time period. By way of example, the given time period may correspond to a duration of an event, and the size of the haptic portion 208 will increase during the duration of the event, until the haptic portion consumes substantially all of the interface surface approaching the conclusion of the time allotted for the event. In a more specific example, the device 100 may be worn by a user giving a live presentation, with the presentation scheduled to last for one hour. In this example, as time elapses, the haptic output becomes perceptible at the interface surface 112. For example, at the start of the presentation, there is no active haptic output on the interface surface 112. FIG. 2A may represent the state of the device after approximately 15 minutes, FIG. 2B may represent the state of the device after approximately 30 minutes, and FIG. 2C may represent the state of the device after approximately 45 minutes. By contacting the interface surface 112, e.g., dragging a single finger along the interface surface, the presenter may have some information about an amount of time elapsed relative to an amount of time remaining.

However, contacting both the interface surface 112 and the reference haptics 108 will provide more precise information to the user. For example, if the interface surface has a length L, reference haptic 108a may be disposed at a position corresponding to L/4, reference haptic 108b may be disposed at a position corresponding to L/2, and reference haptic 108c may be disposed at a position corresponding to 3L/4. Thus, as the user moves her thumb and forefinger along either direction of the arrow 202, the user can interpret the correspondence of the size of the haptic portion 204 relative to the position of the reference haptics 208 to know, within a relatively small window, how much time has elapsed and/or how much time remains for the presentation. For example, the user may interpret the state shown in FIG. 2C as a notification that fewer than 15 minutes remain, and therefore the presentation should be drawing to a conclusion.

As will be appreciated, in the foregoing example, a presenter may use implementations of this disclosure to track time, without diverting eye contact from the audience to look at a clock, timer or other device. In similar implementations, the haptic portion 204 may decrease in size as time elapses, for example going from extending across substantially all of the interface surface 112 near the beginning of the time and eventually going away proximate the end of the presentation. In still other implementations, the haptic portion 204 may maintain a predetermined size and shape, but move from a start position, e.g., proximate a top edge or bottom edge of the interface surface 112, to a positon proximate the other of the tope edge or the bottom edge.

Other uses and applications also are contemplated. For example, the device 100 could be used in a similar manner by an attendee of the presentation, to avoid obvious time-checking. Similarly, an athlete could determine how far into a paced or timed workout she is, without the need for looking at her watch or a timer.

In other implementations, the device 100 may not be associated with a specific event, but could be used to track time more generally. For example, it may be common for some users to think about time in 15 minute increments. For instance, if asked the time, many may reply with "about 11:15" when it is 11:12 or "a half past 7" when, in fact, it is 7:34. As detailed above, the device 100 as configured may be useful to effectively determine 15 minute intervals up to an hour. Thus, assuming the user knows the hour, he can readily estimate the minute with close enough approximation within that hour, without looking at the device 100.

Modifications to the example described with reference to FIGS. 1, 2A, 2B, and 2C also will be appreciated. For example, while the example described a one-hour duration for the event, the duration may be selected by the user, for example using an application installed or accessible through the device 100. Other time-dependent uses will be appreciated by those having ordinary skill in the art, with the benefit of this disclosure.

The device 100 may also be used for time-independent applications. For example, the device 100 may be able to determine movement or distance travelled. Thus, for example, a user desiring to walk a mile may associated each of the reference haptics with a quarter mile, for example, and the active haptic will change to indicate actual distance travelled. Thus, the user may, by touching the active haptic portion and the reference haptics, ascertain a distance travelled and/or distance remaining.

Moreover, the device 100 may be capable of receiving information, such as via phone calls, text messages, emails, or the like. While it is conventional to alert a recipient via haptic output, e.g., via a vibration, of receipt of an incoming communication, conventional applications also then require the user to look at the device to determine a sender or originator of the incoming correspondence. In examples of the present disclosure, information about such received information may be conveyed to the user without the need for the user to look at the device. For example, different senders, such as in a contact list, may be prioritized and the priority may be used to control a size or position of the haptic portion 204. An example is illustrated in FIGS. 3A and 3B.

In FIGS. 3A and 3B, the device 100 varies the position of a haptic output 302 depending upon the incoming correspondence. For example, if an incoming text message is from a high priority individual, the haptic portion 302 may be positioned closer to a top edge of the display 102, such as illustrated in FIG. 3B. Conversely, if the received correspondence is from a lower priority individual, the haptic portion 302 may be positioned proximate a bottom edge of the display 102, as illustrated in FIG. 3A. In this example, the haptic portion 302 is a small lateral band arranged along the interface surface 112 with the position of the band varying depending upon the priority level. A user contacting the device can readily discern the position of the band using the reference haptics. When the band is adjacent the reference haptic 108a, as in FIG. 3A, correspondence is lower priority, whereas when the band is adjacent the reference haptic 108c, the user can readily identify that the correspondence is higher priority.

In other implementations, instead of adjusting the position of the haptic portion 302, a higher priority may be conveyed to a user by increasing the area of the haptic output. In the foregoing examples, a user may be alerted to an incoming correspondence via conventional means, such as an audible cue (e.g., a ring or tone) or a tactile cue (e.g., a vibration), but may contact the device in the manner described above to determine whether immediate attention should be paid to the correspondence. Thus, the user need not continually look to the device to determine whether incoming correspondence is or is not important.

In each of the foregoing examples, the reference haptics 108 are provided as reference points on a side of the device 100 that provide tactile context for information conveyed via an active haptic output on the device. The position and number of the reference haptics may be varied, for example, to provide different reference points.

Figure 4:
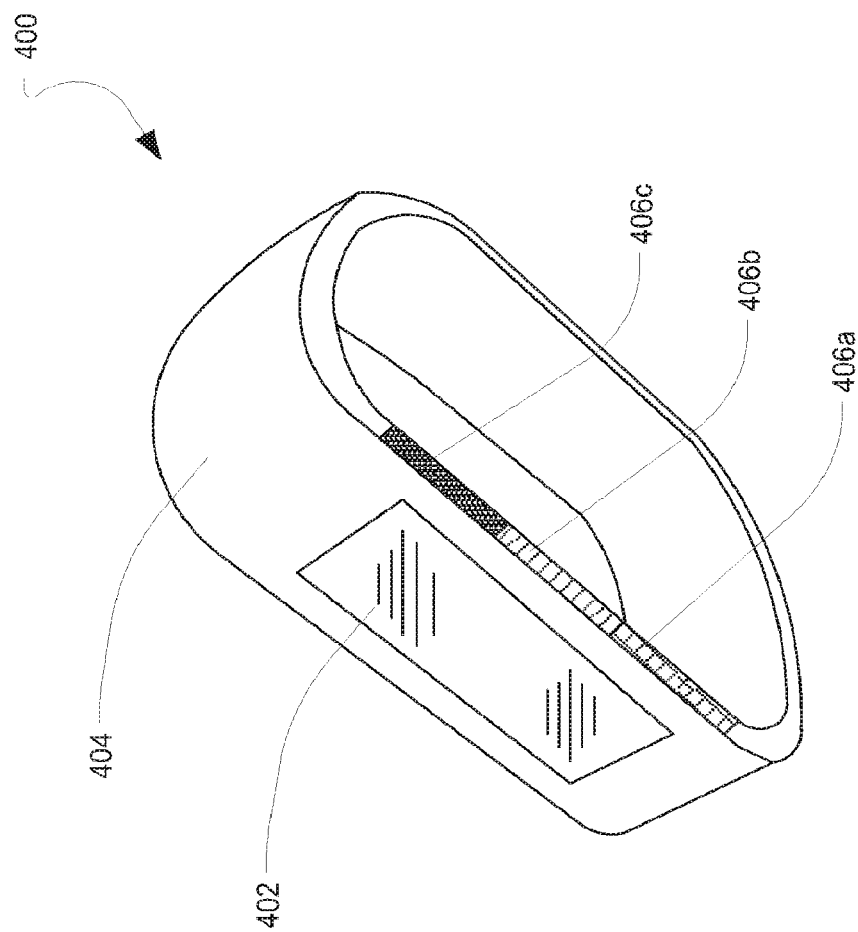
FIG. 4 is a perspective view of an electronic device incorporating active and passive haptics according to one or more example embodiments of this disclosure.

Other modifications and variations also are contemplated. For example, FIG. 4 shows an example in which a device 400, similar to the device 100 described above includes a display 402 disposed in a housing 404. In this example, however, reference haptics 406a, 406b, and 406c are disposed as areas of varying texture, instead of three bumps or protrusions. In FIG. 4, reference haptic 406a is a cross-hatched feature, which may have the feeling of a knurled surface, reference haptic 406b is a plurality of parallel lines which have the feeling of a series of ridges on the surface, and reference haptic 406c is a plurality of small bumps or dimples, which will give a completely different tactile sensation. As will be appreciated, more or fewer reference haptics may be provided, and with additional or other surface features.

Varying the textures may provide a different aesthetic, but a similar functionality. Specifically, the device 400 may be used in much the same way as the device 100 described above. That is, each reference haptic provides tactile context to an active haptic on the interface surface. When only three reference haptics 406a, 406b, 406c are provided, each may comprise a third of the length L of the display, as opposed to the quartering of the display accomplished by having three spaced haptics, as in the device 100. In additional implementations, the surface area, number, and the like of the reference haptics 406 may be increased or decreased, and other features may also be changed.

Although in the devices 100, 400 described above the reference haptics are disposed on the side of the housing, in other implementations, the reference haptics may be disposed on additional or other surfaces of the housing. For instance, reference haptics may be disposed on both sides of the housing, e.g., to enable additional ways of interacting with the device. For example, it may allow a user to interact with the device using either his right or left wrist.

Figure 5:
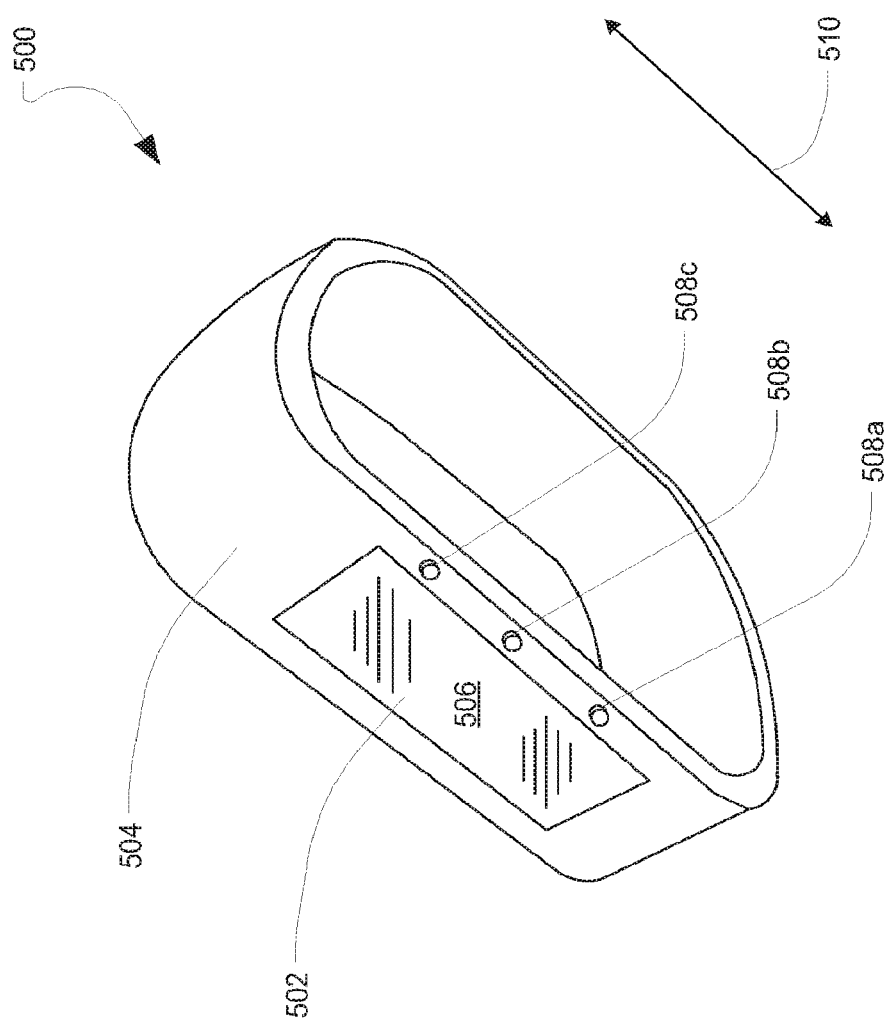
FIG. 5 is a perspective view of an electronic device incorporating active and passive haptics according to one or more example embodiments of this disclosure.

In still other examples, one or more reference haptics may also or alternatively be disposed on a top surface of the housing, e.g., directly proximate the interface surface 112. An example of such an example is illustrated in FIG. 5, in which an electronic device 500 includes a display 502 retained by a housing 504. The display 502 includes an interface surface 506 at which an active haptic output may be felt by a user, as in examples described above. An active haptic portion 508 is a portion of the interface surface 506 at which the haptic output is perceptible to the user, and as in previous examples, may be varied, e.g., by position, size, shape, or the like, to convey some information, such as time, a characterization of an incoming correspondence, or the like. The device 500 also includes reference haptics 508a, 508b, 508c (collectively reference haptics 508) which may be protrusions, indentations or any surface feature perceptible via user contact. Placing the reference haptics 508 proximate the interface surface may allow the user to more readily interact with the device. For example, the user may slide a single finger, such as in a direction of arrow 510, to simultaneously contact the interface surface 506 and the reference haptics 508. Alternatively, the user may slide two fingers, e.g., in the direction of the arrow 510, one generally along the interface surface 506 and the other along the reference haptics 508.

As in previous examples, characteristics of the active haptic portion 506, e.g., the size, shape or location of the active haptic portion 506, are varied to provide different information. The reference haptics 508 are provided as tactile references to assist in understanding the different information conveyed by the active haptic portion 506. In some implementations, the reference haptics 508 provide a spatial or positional awareness on the device and/or relative to the interface surface 506, and the changing, active haptic output relates to a specific event, e.g., time relating to the event, priority of received correspondence, etc.

Figure 6:
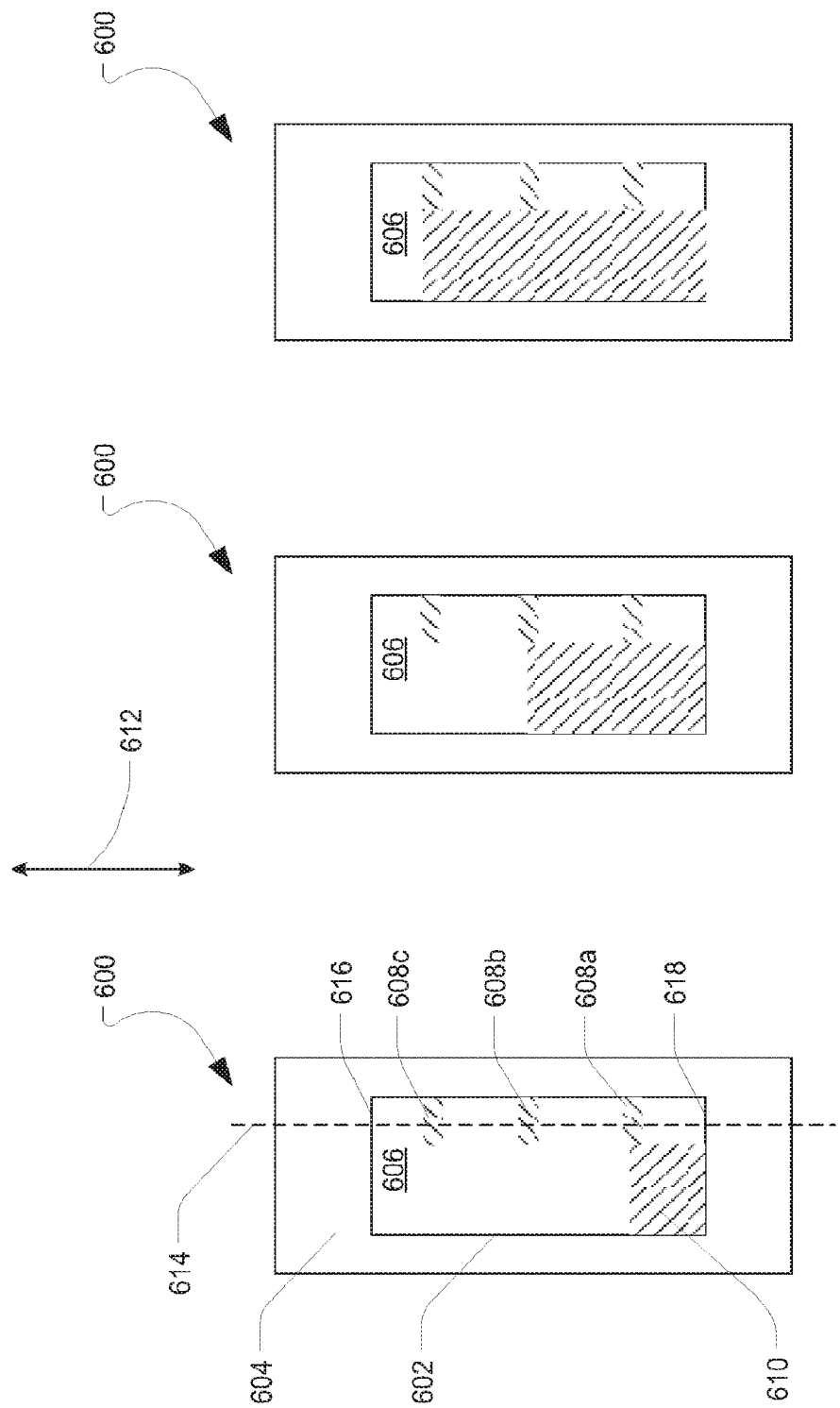
FIGS. 6A-6C are plan views illustrating various states of an electronic device incorporating active and passive haptics according to one or more examples of this disclosure.

Other modifications to the device 500 also are contemplated. For example, while FIG. 5 shows the reference haptic regions as being next to, or adjacent, the interface surface, in other implementations the reference haptics may be incorporated into the display. For example, FIG. 6 illustrates an example in which an electronic device 600 includes a display 602 retained by a housing 604. The display 602 is a haptic display that can be controlled to provide one or more areas at which a haptic output is perceptible via user contact with an interface surface 606 of the display 602. By controlling the haptic output at the interface surface 606, both active and reference haptic outputs can be generated.

For example, FIG. 6 illustrates three reference haptics 608a, 608b, 608c (collectively, reference haptics 608), which are areas or regions at which a haptic output is perceptible via user contact with the interface surface, and an active haptic region 610 at which a haptic output also is perceptible via user contact with the interface surface 606. In implementations, the reference haptics 608a, 608b, 608c may function in much the same manner as the reference haptics 108, 406, 508 described above. For example, a user contacting the device will perceive the reference haptics 608a, 608b, 608c as having a texture, e.g., a non-smooth texture, different from the rest of the interface surface 606 in much the same manner that a user would feel the topographically offset reference haptics 108, 508 or the textured reference haptics 406. More specifically, a user sliding her finger along the interface surface 606, such as in a direction of arrow 612 along line 614, will feel a relatively smooth surface proximate a top edge 616 of the interface surface 606, a textured surface at the reference haptic 608c, a smooth surface beneath the reference haptic 608c, a textured surface at the reference haptic 608b, a smooth surface beneath the reference haptic 608b, a textured surface at the reference haptic 608a, and a smooth surface beneath the reference haptic 608a, proximate a bottom edge 618 of the interface surface 606. In some examples, each of the reference haptics 608 may have the same texture, whereas in other examples some or all of the reference haptics 508 can have different textures.

The active haptic region 610 may be controlled in much the same manner as the haptic portions described above. For example, the haptic portion may increase or decrease in size or change location to identify a passage of time, to convey information about received correspondence, and the like. Thus, the device 600 may function in the same manner as the devices 100, 400, 500 described above.

Unlike examples described above, however, the reference haptics 508 may be changed, e.g., depending upon a specific application. For example, consider again the scenario described above with respect to FIGS. 1, 2A, 2B, and 2C, in which the user is making an hour-long presentation. With the fixed reference haptics 108, the reference haptics were disposed at ¼L increments, thereby corresponding to 15-minute intervals. While, as illustrated in FIG. 6, the reference haptics 608 may be similarly spaced on the device 600, a user may prefer to know when 5 or 10 or 15 minutes remain or when 10 minutes has elapsed and 10 minutes remain, or so forth. In implementations of this disclosure, the user may be able to determine the position(s) of the reference haptic(s), e.g., via a user interface or an application interface. Accordingly, in some examples, the reference haptics are present only for the duration of the event, and are not perceptible at other times. Thus, in the example of the presentation, the reference haptics 508 will be perceptible for the duration of the meeting and the active haptic portion will change as time passes. In contrast to previous examples in which the reference haptics are fixed, before and after the meeting, the reference haptics may not be perceptible at all.

Although the device 600 is illustrated as displaying the active haptic portion 610 and the reference haptics 608 side-by-side on the interface surface, other arrangements also are contemplated. For example, the active haptic portion 610 and the reference haptics 608 may overlap. In some examples, the reference haptics may extend completely across the interface surface (e.g., between opposite lateral edges of the interface surface), and the area of the active haptic portion will increase to eventually cover the entire interface surface. In this example, the reference haptics may provide a first tactile perception while the active haptic portion may have a different tactile perception. In some examples, the tactile perception of the reference haptics and the active haptic portion may be the same, but with a higher intensity being present at the overlapping regions to allow the user to discern between the areas including and not including the reference haptics.

Thus, the examples described with reference to FIG. 6 contemplate adjustable reference haptics, for example, which are application or use specific. Other types of adjustable or reference haptics may also or alternatively be used.

For example, physical reference haptics like the reference haptics 108 described above may be movable on the device. In one implementation, one or more of the reference haptics are disposed on a track or slider that allow for user manipulation of the relative position of the respective haptic(s). In other examples, reference haptics may be provided on a case or skin that can be selectively coupled to the device that incorporates the haptic display. In this manner, the user may have a plurality of skins or cases, each for a different use. In still other implementations, actuators or the like may be provide, e.g., in the housing of the device, that are actuable to physically deform the housing, thereby creating a reference haptic. Thus, in some examples, the actuators may create selective surface features on surfaces of the housing.

The active haptic portions (and reference haptics, when provided on the interface surface) may result from modulating surface friction at the user interface surface. In other implementations, the active haptic portion and/or the reference haptics may also result from physical changes at the interface surface. For example, some conventional haptic displays use a polymeric top sheet that can be contoured to create a varying topography at the interface surface. This haptic technology may alternatively be used, or used in combination with, the friction technology described above.

Figure 7:
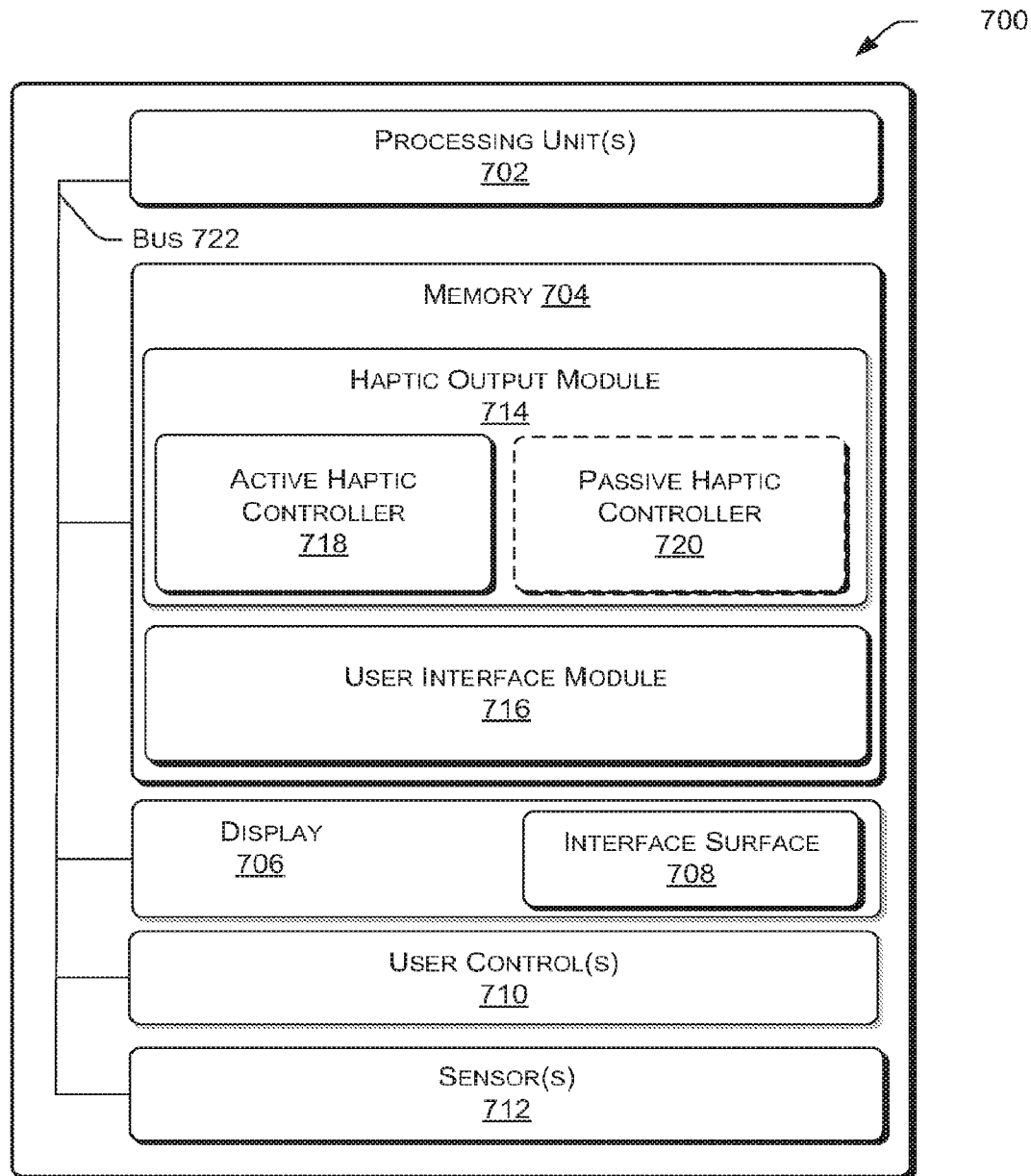
FIG. 7 is a block diagram depicting components of an example electronic device, such as the electronic device illustrated in FIG. 1.

FIG. 7 is an illustrative schematic of an electronic device, such as the electronic device 100 of FIG. 1. The electronic device 700 may be a computing device that is configured to include a plurality of haptic outputs.

The device 700 is illustrated in FIGS. 1-6 as representing a wearable device, such as a wrist-worn device, although the device may represent any number of electronic devices, including but not limited to, a laptop computer, a desktop computer, a smart phone, an electronic reader device, a mobile handset, a personal digital assistant (PDA), a portable navigation device, a portable gaming device, a game console, a tablet computer, a portable media player, and so on. In some instances, the device 102 may comprise a mobile device, while in other instances the device 102 may comprise a stationary device.

The device 700 may be equipped with one or more processor(s) 702, memory 704, a display 706 including an interface surface 708, user control(s) 710, and/or one or more sensor(s) 712. Although not illustrated in FIG. 7, the device 700 may also include or be associated with one or more network interfaces, a power source, other input and/or output peripheral devices (e.g., a mouse, a non-integrated keyboard, a joystick, a microphone, a camera, a speaker, a printer, etc.), and/or other elements typically associated with a computing device. Some or all of the above components of the device 700, whether illustrated or not illustrated, may be in communication with each other and/or otherwise connected via one or more buses or other known means. Such connections are illustrated schematically in FIG. 7.

The one or more processor(s) 702 may include a central processing unit (CPU), a graphics processing unit (GPU), a microprocessor, and so on. Alternatively, or in addition, the processor(s) 702 may include one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc. The processor(s) 702 may be operably connected to and/or otherwise in communication with the memory 704 and/or other components of the device 700 described herein. In some embodiments, the processor(s) 702 may also include on-board memory configured to store information associated with various operations and/or functionality of the processor(s) 702.

The memory 704 may include one or a combination of computer readable media operably connected to the processor(s) 702. Computer readable media may include computer storage media and/or communication media. Computer storage media includes volatile and non-volatile, removable and non-removable media implemented in any method or technology for storage of information such as computer readable instructions, data structures, program modules, or other data. Computer storage media includes, but is not limited to, phase change memory (PRAM), static random-access memory (SRAM), dynamic random-access memory (DRAM), other types of random-access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. In contrast, communication media embodies computer readable instructions, data structures, program modules, or other data in a modulated data signal, such as a carrier wave, or other transmission mechanism. As defined herein, computer storage media does not include communication media.

The device 700 may communicate with one or more like devices, servers, service providers, or other like components via one or more networks (not shown). The one or more networks may include any one or combination of multiple different types of networks, such as cellular networks, wireless networks, Local Area Networks (LANs), Wide Area Networks (WANs), Personal Area Networks (PANs), and the Internet. Additionally, the service provider may provide one or more services to the device 700. The service provider may include one or more computing devices, such as one or more desktop computers, laptop computers, servers, and the like. The one or more computing devices may be configured in a cluster, data center, cloud computing environment, or a combination thereof. In one example, the one or more computing devices provide cloud computing resources, including computational resources, storage resources, and the like, that operate remotely to the device 700.

The memory 704 may include software functionality configured as one or more "modules." The term "module" is intended to represent example divisions of the software for purposes of discussion, and is not intended to represent any type of requirement or required method, manner or organization. Accordingly, while various "modules" are discussed, their functionality and/or similar functionality could be arranged differently (e.g., combined into a fewer number of modules, broken into a larger number of modules, etc.). Further, while certain functions and modules are described herein as being implemented by software and/or firmware executable by the processor 104, in other embodiments, any or all of the modules may be implemented in whole or in part by other hardware components of the device 700 (e.g., as an ASIC, a specialized processing unit, etc.) to execute the described functions. In some instances, the functions and/or modules are implemented as part of an operating system. In other instances, the functions and/or modules are implemented as part of a device driver (e.g., a driver for a touch surface), firmware, and so on. Modules, whether characterized as software, firmware or otherwise, are ultimately implemented in hardware, for example, within a programmed processor, FPGA, or other circuit, and this hardware may be located in a local device or in a remote location such as a datacenter. As illustrated in FIG. 7, the memory 704 may include a haptic output module 714 and a user interface module 716. Although not shown in FIG. 7, in additional embodiments, the memory 704 may additionally or alternatively include one or more additional modules. Although in the architecture of FIG. 7 the modules 714, 716 are illustrated as being included in the device 700, alternatively, the modules 714, 716 and/or other modules associated with the device 700 may be included in the service provider or network described above. As such, in some instances the device 700 may act as an input/output device that receives user input and outputs content, while the service provider performs functions for classifying user input, learning information, and other operations.

The haptic output module 714 may control haptic outputs from the device 702. For example, the haptic output module 714 is illustrated as including or being otherwise associated with an active haptic controller 718 that controls the active or changing haptic outputs described in detail above. The active haptic controller 718 may control the shape, the duration, the intensity, and/or other features of active haptic outputs perceptible at the interface surface 708 of the device 700. In some embodiments, such as the examples described in connection with FIGS. 6A-6C, the haptic output module 714 may also include or otherwise be associated with a reference haptic controller 720. For example, the reference haptic controller 720 may control the shape, location and/or other features or characteristics of configurable reference haptics. In some implementations, instead of including the active haptic controller 718 and the reference haptic controller 720, a single haptic controller may control both active and reference haptic outputs.

The user interface module 716 may receive user inputs, for example, to inform functioning of the haptic output module. For example, via the user interface module the user may choose applications that use the haptic output functioning of this disclosure. In some examples, a user may select a timer application to execute functioning such as the timing functioning described above with reference to FIGS. 2A-2C. The user also may set a duration for a meeting. Also via the user interface module, the user may prioritize contacts, e.g., for use in the application described above with reference to FIGS. 3A and 3B.

The user interface module may receive user input via interaction with a touch surface, which may be the interface surface 708 associated with the display 706 and/or some other input device. The touch surface may comprise any type of digitizer configured to detect a touch contact. The detection may be based on capacitive, optical, or any other sensing technique. In one example, the touch surface includes a touch pad (also known as a track pad) having a tactile sensor to sense touch, pressure, and/or force (of an area of contact). Alternatively, or additionally, the touch surface may include a touch screen. In some instances, the touch surface may be implemented as a device that includes a touch pad and a mouse (e.g., a combination touch pad-mouse device external to or integrated with the device 700). Further, in some instances the touch surface may be implemented as a touch screen display configured to display content, while the touch pad may not be configured to display content.

The display 706 may present content in a human-readable format to a user. The display 706 may be reflective, emissive, or a combination of both. Reflective displays utilize incident light and include electrophoretic displays, interferometric modulator displays, cholesteric displays, and so forth. Emissive displays do not rely on incident light and, instead, emit light. Emissive displays include backlit liquid crystal displays, time multiplexed optical shutter displays, light emitting diode displays, and so forth. When multiple displays are present, these displays may be of the same or different types. For example, one display may be an electrophoretic display while another may be a liquid crystal display.

The display is shown in example embodiments in a generally rectangular configuration. However, it is understood that the display may be implemented in any shape, and may have any ratio of height to width. Also, for stylistic or design purposes, the display may be curved or otherwise non-linearly shaped. Furthermore the display may be flexible and configured to fold or roll.

Moreover, a benefit of this disclosure may be that a user can interact with an electronic device without looking at the device. In some examples, the device may not include a visual display at all. Thus, in examples described above, the display 706 may function only to provide haptic outputs. For ease of use and interaction, such a device may be synced with or otherwise communicate with a device that includes a visual display.

The user controls 710 may be any device via which a user can interact with the device 700. The user controls 710 may include, but are not limited to, a keypad, a keyboard, navigational keys, a power control button, a touchpad, and so on. User input at the user controls may be used by the user interface module 716.

The sensor(s) 712 may include other features or mechanisms that sense environmental conditions. For example, sensors may include inertial sensors (e.g., accelerometer, gyros, pedometer, etc.), location sensors (e.g., GPS), health sensors (e.g., heart rate monitor, etc.) and the like. Data from these sensors may be collected and conveyed to the user via the device, e.g., represented by the active haptic.

Figure 8:
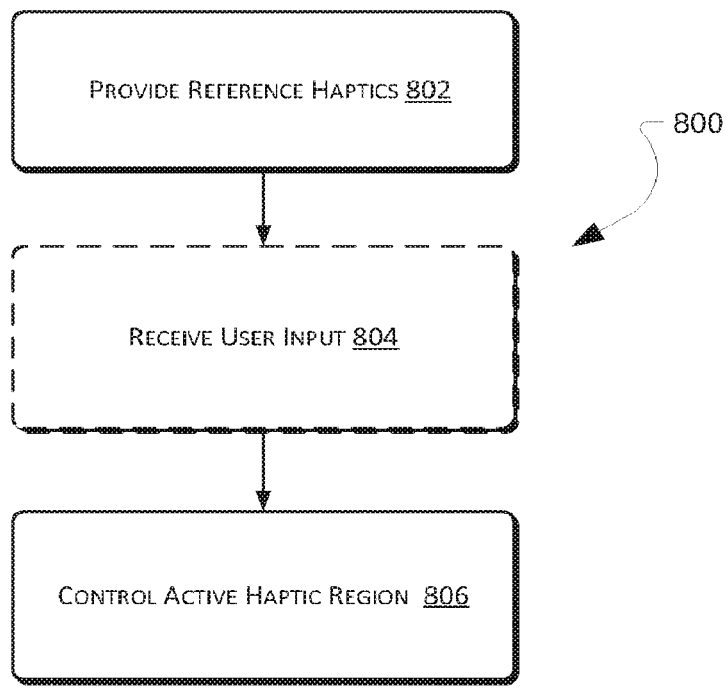
FIG. 8 is a block diagram depicting an example process of conveying information to a user with active and reference haptics.

FIG. 8 is a block diagram illustrating a process 800 of conveying information to a user via haptics on an electronic device, such as the devices described above.

At 802, the process 800 provides a plurality of reference haptics. The reference haptics may be provided as features on the device perceptible by touch. The reference haptics may be physical features, such as protrusions, indentations, surface finishes and so forth formed on a surface of the device. In other implementations, the reference haptics may include a haptic output perceptible by a user upon contacting a haptic display surface. The reference haptics may be provide an environment or context that a user may use to orient his or her sense of touch relative to the device.

At 804, the process 800 optionally receives a user input. The user input may select an application to be executed by the device. Moreover, the received user input may set parameters for an application, such as by defining a duration of a meeting to be timed using the device, by accepting user classifications of contacts or correspondence types, and/or by establishing other preferences or instructions.

At 806, the process 800 controls an active haptic region. The active haptic region is sized, shaped, positioned and/or the like to convey information to the user. In examples described in detail above, the information may include time-dependent information, such as an amount of time elapsed/remaining in an event, or time-independent information, such as an indication of receipt of correspondence and additional information about that correspondence. The active haptic region is discernible contemporaneously with the reference haptic(s) provided at 802, to convey complete information to a user.

EXAMPLE CLAUSES

A: An electronic device includes an active haptic display comprising an interface surface disposed for user contact; an active haptic controller configured to generate a varying haptic feedback perceptible via user contact at the interface surface; and a reference haptic disposed for user contact contemporaneous with the user contact at the interface surface, the reference haptic providing information related to the varying haptic feedback.

B: The electronic device of paragraph A, wherein the active haptic controller generates the varying haptic feedback by modulating a surface friction at the interface surface.

C: The electronic device of paragraph A or paragraph B, wherein the active haptic display comprises a glass substrate and a plurality of piezoelectric actuators disposed about a periphery of the glass substrate or a conducting layer and an insulating layer disposed on the glass substrate.

D: The electronic device of any of paragraphs A through C, wherein the varying haptic feedback comprises a first haptic feedback and the reference haptic comprises a second haptic feedback perceptible via user contact with the interface surface.

E: The electronic device of any of paragraphs A through D, further comprising a housing, wherein the active haptic display is disposed in the housing and the reference haptic is disposed on the housing.

F: The electronic device of any of paragraphs A through E, wherein a housing comprises a band for retaining the electronic device on a user's wrist and the reference haptic is disposed on a side of the housing proximate the interface surface.

G: An electronic device includes a housing; a display disposed in the housing and including an interface surface arranged for user contact, the interface surface including a first haptic providing a time-dependent haptic output; and a second haptic disposed on the housing or the interface surface and providing a time-independent haptic output related to the time-dependent haptic output.

H: The electronic device of paragraph G, wherein the display comprises a sheet of glass and the first haptic modulates a surface friction of the sheet of glass.

I: The electronic device of paragraph G or paragraph H, wherein the second haptic comprises a protrusion or an indentation disposed in the housing.

J: The electronic device of any of paragraphs G through I, further comprising a case at least partially covering the housing and wherein the case includes the second haptic.

K: The electronic device of any of paragraphs G through J, wherein the second haptic comprises a plurality of second haptics.

L: The electronic device of any of paragraphs G through K, wherein a plurality of second haptics are spaced from each other.

M: The electronic device of any of paragraphs G through L, wherein a plurality of second haptics include haptics having at least two different surface textures.

N: The electronic device of any of paragraphs G through M, wherein the first haptic is coupled to a haptic controller configured to vary the time-dependent haptic output relative to each of a plurality of second haptics.

O: A method of conveying information via an electronic device having an interface surface arranged for user contact, the method including: generating, at a first time, a first haptic output perceptible by user contact with the interface surface; generating, at a second time, a second haptic output perceptible by the user contact with the interface surface; and providing, at the first time and at the second time, one or more reference haptics arranged for user contact contemporaneous with the user contact with the interface surface.

P: The method of paragraph O, wherein the generating the first active haptic output and the generating the second active haptic comprise modulating a surface friction at the interface surface.

Q: The method of paragraph O or paragraph P, wherein the providing the one or more reference haptics comprises generating a third haptic output perceptible by the user via user contact with the interface surface.

R: The method of any of paragraphs O through Q, wherein the third haptic output is imperceptible by the user before the first time and after the second time.

S: The method of any of paragraphs O through R, wherein the one or more reference haptics comprise a surface feature on the housing.

T: The method of any of paragraphs O through S wherein a surface feature comprises at least one of a protrusion, an indentation, or a surface texture.

CONCLUSION

Although the techniques have been described in language specific to structural features and/or methodological acts, it is to be understood that the appended claims are not necessarily limited to the features or acts described. Rather, the features and acts are described as example implementations of such techniques.

The operations of the example processes are illustrated in individual blocks and summarized with reference to those blocks. The processes are illustrated as logical flows of blocks, each block of which can represent one or more operations that can be implemented in hardware, software, or a combination thereof. In the context of software, the operations represent computer-executable instructions stored on one or more computer-readable media that, when executed by one or more processors, enable the one or more processors to perform the recited operations. Generally, computer-executable instructions include routines, programs, objects, modules, components, data structures, and the like that perform particular functions or implement particular abstract data types. The order in which the operations are described is not intended to be construed as a limitation, and any number of the described operations can be executed in any order, combined in any order, subdivided into multiple sub-operations, and/or executed in parallel to implement the described processes. The described processes can be performed by resources associated with one or more device(s) 102 and/or 108 such as one or more internal or external CPUs or GPUs, and/or one or more pieces of hardware logic such as FPGAs, DSPs, or other types of accelerators.

All of the methods and processes described above may be embodied in, and fully automated via, software code modules executed by one or more general purpose computers or processors. The code modules may be stored in any type of computer-readable storage medium or other computer storage device. Some or all of the methods may alternatively be embodied in specialized computer hardware.

Conditional language such as, among others, "can," "could," "might" or "may," unless specifically stated otherwise, is understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example. Conjunctive language such as the phrase "at least one of X, Y or Z," unless specifically stated otherwise, is to be understood to present that an item, term, etc. may be any of X, Y, or Z, or a combination or sub-combination thereof.

Any routine descriptions, elements or blocks in the flow diagrams described herein and/or depicted in the attached figures should be understood as potentially representing modules, segments, or portions of code that include one or more executable instructions for implementing specific logical functions or elements in the routine. Alternate implementations are included within the scope of the examples described herein in which elements or functions may be deleted, or executed out of order from that shown or discussed, including substantially synchronously or in reverse order, depending on the functionality involved as would be understood by those skilled in the art. It should be emphasized that many variations and modifications may be made to the above-described examples, the elements of which are to be understood as being among other acceptable examples. All such modifications and variations are intended to be included herein within the scope of this disclosure and protected by the following claims.

The invention claimed is:

1. An electronic device comprising:
   an active haptic display comprising an interface surface disposed for user contact;
   an active haptic controller configured to generate a varying haptic feedback perceptible via the user contact at the interface surface, wherein a size of the haptic feedback varies relative to a size of the interface surface during a time period the haptic feedback is provided; and
   one or more reference haptics disposed for the user contact contemporaneous with the user contact at the interface surface, the one or more reference haptics providing information related to the haptic feedback.

2. The electronic device of claim 1, wherein the time period corresponds to the duration of an event.

3. The electronic device of claim 2, wherein the size of the haptic feedback increases or decreases during the event.

4. The electronic device of claim 3, wherein the size of the haptic feedback increases linearly during the event until the haptic feedback consumes substantially all of the interface surface.

5. The electronic device of claim 4, wherein the haptic feedback consumes substantially all of the interface surface at or approaching conclusion of the event.

6. The electronic device of claim 4, wherein the haptic feedback for the event is not perceptible prior to or at the beginning of the event.

7. The electronic device of claim 3, wherein the size of the haptic feedback decreases during the event until the haptic feedback is no longer perceptible.

8. The electronic device of claim 3, wherein the one or more reference haptics comprises at least a first reference haptic and a second reference haptic, the first reference haptic providing an indication that a first amount of time has elapsed during the event, the second reference haptic providing an indication that a second amount of time has elapsed during the event.

9. The electronic device of claim 1, wherein a position, on the interface surface, for each of the one or more reference haptics is configurable by a user of the electronic device.

10. An electronic device comprising:
    an active haptic display comprising an interface surface disposed for user contact;
    an active haptic controller configured to generate a varying haptic feedback perceptible via the user contact at the interface surface, wherein a position of the haptic feedback varies on the interface surface during a detected event; and
    one or more reference haptics disposed for the user contact contemporaneous with the user contact at the interface surface, the one or more reference haptics providing information related to the haptic feedback.

11. The electronic device of claim 10, wherein the detected event is user movement or a travelled distance.

12. The electronic device of claim 11, wherein each of the one or more reference haptics is associated with at least one of a distance travelled or a distance remaining.

13. The electronic device of claim 10, wherein, during a first time of the detected event, the haptic feedback is presented in a haptic area of the interface surface, the haptic area having a size and a first position in the interface surface.

14. The electronic device of claim 13, wherein, during a second time of the detected event, the haptic feedback is presented in the haptic area of the interface surface, the haptic area having the size and a second position in the interface surface.

15. The electronic device of claim 14, wherein the haptic area of the interface surface is positioned at or near a first edge of the interface surface at the first time.

16. The electronic device of claim 15, wherein the haptic area of the interface surface is positioned at or near a second edge of the interface surface at the first time, the second edge of the interface surface being opposite the first edge of the interface surface.

17. A method of conveying information via an electronic device having an interface surface arranged for user contact, the method comprising:
    generating, by an active haptic controller at a first time, a first haptic output perceptible by first user contact with the interface surface;
    providing, on the interface surface, the first haptic output at a first size and a plurality of reference haptics associated with the first haptic output;
    generating, by the active haptic controller at a second time, a second haptic output perceptible by second user contact with the interface surface; and
    providing, on the interface surface, the second haptic output at a second size and a plurality of reference haptics associated with the second haptic output.

18. The method of claim 17, further comprising:
    generating, by the active haptic controller at a third time, a third haptic output perceptible by third user contact with the interface surface; and
    providing, on the interface surface, the third haptic output at a third size and a plurality of reference haptics associated with the third haptic output.

19. The method of claim 18, wherein:
    the first size of the first haptic output is smaller than the second size of the second haptic output; and the second size of the second haptic output is smaller than the third size of the third haptic output.

20. The method of claim 19, wherein the first size of the first haptic output, the second size of the second haptic output, and the third size of the third haptic output correspond respectively to an amount of time remaining or elapsed during an event.

* * * * *